United States Patent
Yu et al.

(10) Patent No.: US 8,604,535 B2
(45) Date of Patent: Dec. 10, 2013

(54) NON-VOLATILE MEMORY DEVICE AND METHOD OF MANUFACTURING THE SAME

(75) Inventors: Tea-Kwang Yu, Hwaseong-si (KR); Jeong-Uk Han, Hwaseong-si (KR); Yong-Tae Kim, Hwaseong-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 243 days.

(21) Appl. No.: 12/648,386

(22) Filed: Dec. 29, 2009

(65) Prior Publication Data

US 2010/0171168 A1 Jul. 8, 2010

(30) Foreign Application Priority Data

Jan. 6, 2009 (KR) .................. 10-2009-0000944

(51) Int. Cl.
*H01L 29/788* (2006.01)
*H01L 21/762* (2006.01)

(52) U.S. Cl.
USPC ............. 257/321; 257/315; 257/E29.304; 257/E29.3; 257/E21.546; 438/424

(58) Field of Classification Search
USPC ............. 257/321, 315, E29.304, E29.3, 257/E21.546; 438/424
See application file for complete search history.

(56) References Cited

U.S. PATENT DOCUMENTS

| | | | |
|---|---|---|---|
| 6,576,949 B1* | 6/2003 | Park ...................... | 257/314 |
| 7,008,847 B2* | 3/2006 | Park ...................... | 438/264 |
| 2004/0256658 A1* | 12/2004 | Park et al. ............. | 257/315 |
| 2006/0202263 A1* | 9/2006 | Lee ........................ | 257/330 |
| 2007/0063264 A1* | 3/2007 | Huang et al. .......... | 257/321 |
| 2008/0121970 A1* | 5/2008 | Aritome ................ | 257/316 |
| 2009/0321811 A1* | 12/2009 | Lee et al. .............. | 257/321 |
| 2010/0133601 A1* | 6/2010 | Miyazaki et al. ..... | 257/316 |
| 2011/0037115 A1* | 2/2011 | Kim et al. ............. | 257/316 |

FOREIGN PATENT DOCUMENTS

| | | |
|---|---|---|
| JP | 10-022403 | 1/1998 |
| KR | 20030037573 | 5/2003 |
| KR | 20030060315 | 7/2003 |

* cited by examiner

*Primary Examiner* — Whitney T Moore
(74) *Attorney, Agent, or Firm* — Stanzione & Kim, LLP

(57) ABSTRACT

A non-volatile memory device includes an active region in which a channel of a transistor is formed in a substrate, element isolation films defining the active region and formed on the substrate at both sides of the channel at a height lower than an upper surface of the active region, a first dielectric layer, a second dielectric layer, and a control gate electrode formed on the active region in this order, and a floating gate electrode formed between the first dielectric layer and the second dielectric layer so as to intersect the length direction of the channel and extend to the upper surfaces of the element isolation films at both sides of the channel, thereby surrounding the channel.

18 Claims, 13 Drawing Sheets

NON-VOLATILE MEMORY DEVICE AND METHOD OF MANUFACTURING THE SAME

CROSS-REFERENCE TO RELATED APPLICATIONS

This application claims priority under 35 U.S.C. §119 from Korean Patent Application No. 2009-0000944, filed on Jan. 6, 2009, in the Korean Intellectual Property Office (KIPO), the entire contents of which is incorporated herein by reference.

BACKGROUND

1. Field of the General Inventive Concept

The present general inventive concept relates to a non-volatile memory device and a method of manufacturing the same, and more particularly, to an electrically erasable and programmable non-volatile memory device and a method of manufacturing the same.

2. Description of the Related Art

Semiconductor memory devices are classified into volatile memory devices that require power to maintain the stored information and non-volatile memory devices that do not require power to maintain the stored information. The non-volatile memory devices include, for example, a read only memory (ROM) and an electrically erasable and programmable ROM (EEPROM). A floating gate tunnel oxide (FLO-TOX) non-volatile memory device, which is one kind of EEPROM, includes a selection transistor and a memory transistor that are two-dimensionally connected to a bit line. The FLOTOX non-volatile memory device has been generally used for smart cards that have a cell structure having high disturbance resistance, high endurance, and high retention and require high reliability.

However, in the FLOTOX non-volatile memory device, it is difficult to reduce the size of a unit cell. Therefore, research and development for a non-volatile memory device having a three-dimensional structure are required.

SUMMARY

An object of the present general inventive concept is to provide a non-volatile memory device that has a three-dimensional structure capable of improving or maximizing performance and a method of manufacturing the same.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a non-volatile memory device that may include an active region in which a channel of a transistor is formed in a substrate, the channel having a length direction, element isolation films defining the active region and formed on the substrate at both sides of the channel at a height lower than an upper surface of the active region, a first dielectric layer, a second dielectric layer, and a control gate electrode formed on the active region, and a floating gate electrode formed between the first dielectric layer and the second dielectric layer so as to intersect the channel in the length direction and extend to the upper surfaces of the element isolation films at both sides of the channel, to thereby surround the channel.

The floating gate electrode may include, an upper electrode formed above a center of the active region, and a plurality of side electrodes formed at both sides of the center of the active region. The side electrodes may be formed along inclined planes of a plurality of trenches in which the element isolation films are formed.

A tunnel oxide film may be formed with a thickness smaller than that of the first dielectric film between the floating gate electrode and the active region.

The foregoing and/or other aspects and utilities of the present general inventive concept may also be achieved by a method of manufacturing a non-volatile memory device including removing portion of a substrate to form trenches with a predetermined depth, filling the trenches to form element isolation films that define an active region in which a channel of a transistor is formed, removing a portion of the element isolation film in the trench to a predetermined depth to expose the active region, forming a first dielectric film on the entire surface of the substrate, forming a floating gate electrode on the first dielectric layer so as to intersect the channel in a length direction of the channel and extend to the upper surfaces of the element isolation films at both sides of the channel, thereby surrounding the channel, forming a second dielectric film on the entire surface of the substrate, and forming a control gate electrode on the second dielectric film on the floating gate electrode.

The portion of the element isolation film may be removed by a wet etching method. The method of manufacturing a non-volatile memory device may further include forming a sacrificial oxide film on the active region exposed from the element isolation film before the element isolation film is removed.

The foregoing and/or other aspects and utilities of the present general inventive concept may also be achieved by providing a non-volatile semiconductor memory device including a bit line, a contact plug connected to the bit line and connected to a source/drain of a plurality of selection transistors, and a plurality of memory transistors disposed adjacent the selection transistors and disposed above a channel of an active region of a semiconductor substrate, including a plurality of floating gate electrode layers having an upper electrode and side electrodes, wherein the upper electrodes and side electrodes three-dimensionally surround the active region of the memory transistors to intersect the channel in a length direction of the channel.

The foregoing and/or other aspects and utilities of the present general inventive concept may also be achieved by providing a memory cell apparatus including a selection transistor and a memory transistor to be used in a non-volatile memory array, including a substrate having an active region and a plurality of trenches formed in an upper surface of the active region, a plurality of shallow trench isolation (STI) layers formed within the plurality of trenches to a height lower than the upper surface of the active region, the top surface of STI layers having a planar surface within the trenches, and a conductive layer to serve as a floating gate for the selection transistor and memory transistor, the conductive layer including an upper electrode and a plurality of side electrodes in that the plurality of side electrodes extend to the upper surface of the STI layers to surround an active region of the substrate.

The apparatus may also include a tunnel oxide film formed in the memory transistor; and a medium-doped and highly-doped source/drain region formed in the active region below the tunnel oxide film.

The apparatus may also include a gate dielectric layer having a first dielectric film with a first thickness and a second dielectric film of a second thickness thinner than the first thickness formed below the floating gate of the memory transistor. The first gate dielectric film may surround the second dielectric film.

The foregoing and/or other aspects and utilities of the present general inventive concept may be achieved by forming a memory cell including a selection transistor and a memory transistor, the method including forming a semiconductor substrate having an active region and a plurality of trenches formed in an upper surface of the active region, forming a shallow trench isolation (STI) layer within the plurality of trenches to a height lower than the upper surface of the active region, the top surface of STI layer having a planar surface within the trenches, and forming a conductive layer to serve as a floating gate for the selection transistor and memory transistor, the conductive layer including an upper electrode and a plurality of side electrodes such that the plurality of side electrodes extend to the upper surface of the STI layer to surround an active region of the substrate within the memory transistor.

The method may also include forming a tunnel oxide layer above a central portion of the active region.

The method may also include forming a first dielectric film below the conductive layer and a second dielectric film above the conductive layer such that the first and second dielectric films extend to the upper surface of the STI layer to surround an active region of the substrate.

The STI layer may be formed by deposition.

According to the above-mentioned example embodiments of the present general inventive concept, a floating gate electrode that stores electrons may be formed on the upper part and side of a channel region to three-dimensionally surround the active region. Therefore, it is possible to improve or maximize the performance of a device.

BRIEF DESCRIPTION OF THE DRAWINGS

The above and/or other features and utilities of the present general inventive concept will become apparent and more readily appreciated from the following description of the exemplary embodiments, taken in conjunction with the accompanying drawings, in which:

Example embodiments will be more clearly understood from the following brief description taken in conjunction with the accompanying drawings. FIGS. 1 to 6J represent non-limiting, example embodiments as described herein.

FIG. 1 is a circuit diagram schematically illustrating a non-volatile memory device according to an example embodiment of the present general inventive concept;

FIG. 2 is a plan view schematically illustrating the non-volatile memory device according to the example embodiment of the present general inventive concept;

FIG. 3 is a cross-sectional view taken along the line III-III' of FIG. 2;

FIG. 4 is a cross-sectional view taken along the line IV-IV' of FIG. 2;

FIGS. 6A to 6J are cross-sectional views sequentially illustrating a process of manufacturing the non-volatile memory device illustrated in FIG. 4.

Figure 1:
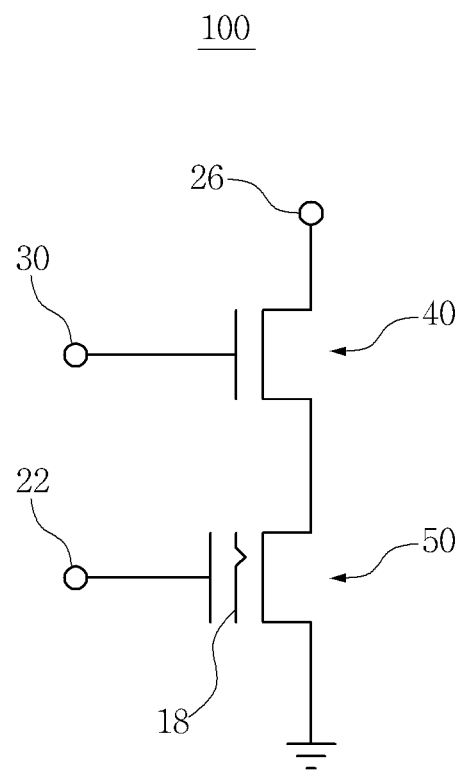

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/ or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a non-volatile memory device and a method of manufacturing the same according to example embodiments of the present general inventive concept will be described in detail. In the following example embodiments, specific details are described with reference to the accompanying drawings, but it will be noted that the specific details are just for ease of understanding of the present general inventive concept by those skilled in the art. However, it will be understood by those skilled in the art that the present general inventive concept can be implemented without the specific details. In addition, in the following description, it will be understood that a layer includes a surface with which the upper surface of a lower layer comes into contact and a part which is spaced a predetermined distance therefrom.

For ease of understanding of the function and operation of the following example embodiments of the present general inventive concept, the example embodiments of the present general inventive concept will be described in detail with reference to FIGS. 1 to 6J.

FIG. 1 is a circuit diagram schematically illustrating a non-volatile memory device according to an example embodiment of the present general inventive concept.

As illustrated in FIG. 1, the non-volatile memory device 100 according to the example embodiment of the present general inventive concept includes a selection transistor 40 and a memory transistor 50 connected in series to each other between a bit line 26 and a ground terminal. The selection transistor 40 switches data input or output through the bit line 26 in response to a signal applied from the word line 30. The memory transistor 50 stores data, and receives or outputs data in response to a control signal applied from the sense line 22. Data is stored in a floating gate electrode 18 of the memory transistor 50.

Figure 2:
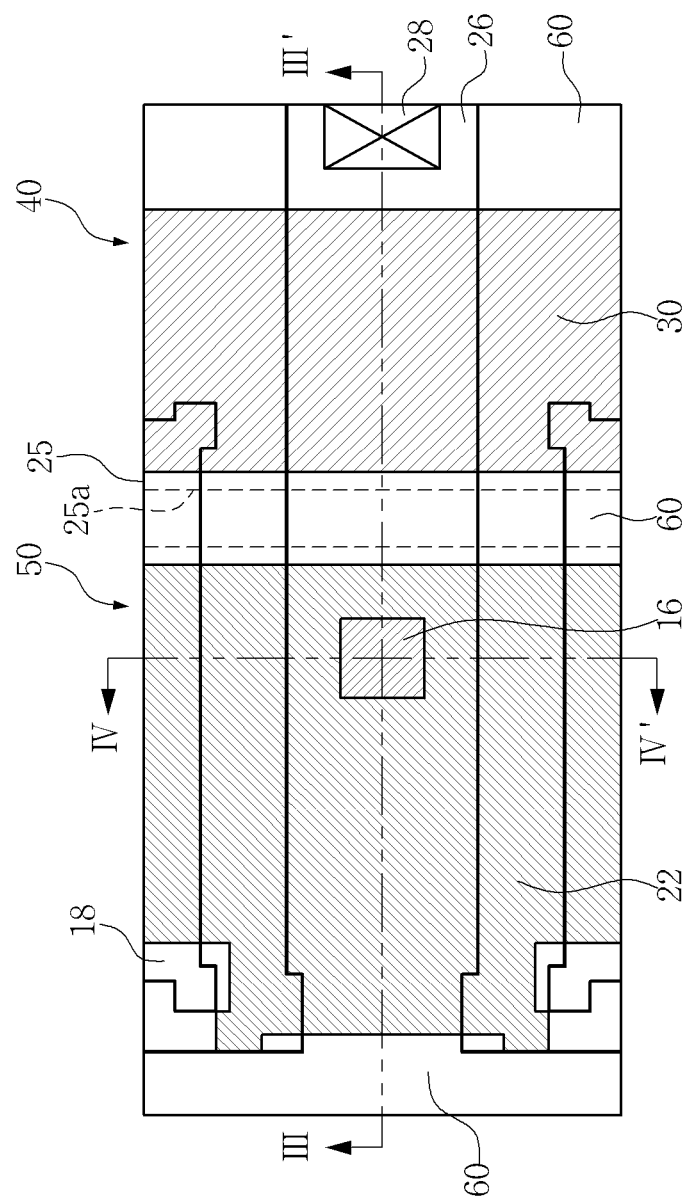

FIG. 2 is a layout plan view of FIG. 1. As illustrated in FIG. 2, in a substrate 10, a contact plug 28 connected to the bit line 26 is provided at one end of an active region 60 formed in an upper portion of the substrate 10 and formed in a horizontal direction (first direction). The word line 30 and the sense line 22 are arranged in a vertical direction and are sequentially provided in a horizontal direction (second direction) from the contact plug 28 of the bit line 26.

The active region of the substrate 10 may be characterized by regions of the substrate 10 in which isolation regions are positioned to form memory cells that include doped regions formed to implement source regions, drain regions, channels, and other regions within the substrate 10 necessary for the operation of the elements discussed herein. The active region 60 exposed between the sense line 22 and the word line 30 may be bordered by spacer regions 25, as illustrated by the dotted lines 25a.

Figure 3:
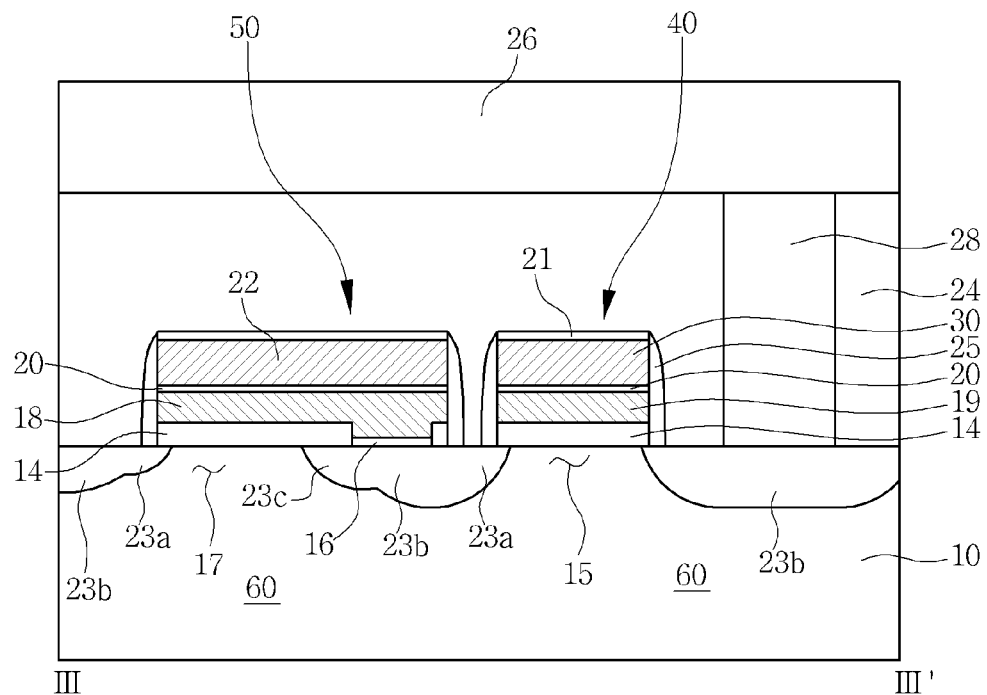

As illustrated in FIGS. 2 and 3, floating gate electrodes 18 and 19 are formed above different sides of the active region 60. A tunnel oxide film 16 that tunnels charge to and from the floating gate electrode 18 may be formed at one side of the floating gate 18 of the memory transistor 50 above a portion of the active region 60.

FIG. 3 is a cross-sectional view taken along the line III-III' of FIG. 2. In FIGS. 2 and 3, the bit line 26 is formed so as to traverse the upper parts of the memory transistor 50 and the selection transistor 40 that allow a channel region 15 of the selection transistor 40 and a channel region 17 of the memory transistor 50 to be formed in the active region.

The bit line 26 is electrically connected to the contact plug 28 that is connected to the drain of the selection transistor 40. The channel regions 15 and 17 of the selection transistor 40 and memory transistor 50 may be depletion regions in which charge induced between the source/drain regions 23a and 23b of each transistor is moved, below a first dielectric film (gate oxide film) 14. The channel regions 15 and 17 may be formed by the voltage applied to the floating gate electrodes 18 and 19 below the word line 30 and the sense line 22. The source/drain regions 23a and 23b may be doped with donor-type (n-type) impurities in the active region 60 of the substrate 10 at both sides of the channel. The source/drain regions 23a and 23b of the selection transistor 40 may be symmetric with respect to the gate electrode 19. That is, the distance of edges of the source/drain regions 23a and 23b that border the channel region 15 may be equidistant from edges of the gate dielectric film 14 of the selection transistor 40.

In the memory transistor 50, a lightly-doped source/drain region 23a and highly-doped source/drain region 23b may be formed at one edge of the channel region 17 and a second higher-doped drain electrode 23b may extend toward the center under the lower part of the tunnel oxide film 16. The memory transistor 50 may also include a medium-doped region 23c positioned partially beneath the tunnel oxide film 16 and partially beneath the gate dielectric film 14. The doping concentration of the medium-doped region 23c may be raised or lowered to a predetermined level to optimize the speed of write and erase functions of the memory transistor 50 as needed. The medium doped region 23c may have a doping concentration and depth equal to or greater than the lightly-doped source/drain region 23a and a doping concentration and depth equal to or less than the higher-doped source/drain region 23b. This structure facilitates the tunneling of electrons applied from the selection transistor 40 to the floating gate electrode 18 through the tunnel oxide film 16.

The word line 30 of the selection transistor 40 is electrically connected to the gate electrode 19 provided below the word line 30. In an example embodiment of the present general inventive concept, a second dielectric film 20 is formed between the gate electrode 19 and the word line 30, and the gate electrode 19 and the word line 30 are electrically connected to each other through a contact hole (not illustrated) formed in the second dielectric film 20. A third dielectric film 21 is formed as an upper gate insulating film on the gate electrode 19 and the word line 30. The outer wall of a gate stack including the gate electrode 19 and the word line 30 is electrically insulated by a spacer 25.

The memory transistor 50 has a structure in which the floating gate electrode 18, the second dielectric film 20, and the sense line 22 are laminated on the first dielectric film 14 and the tunnel oxide film 16 on the active region. The second dielectric film 20 may have an ONO (oxide-nitride-oxide) structure.

Figure 4:
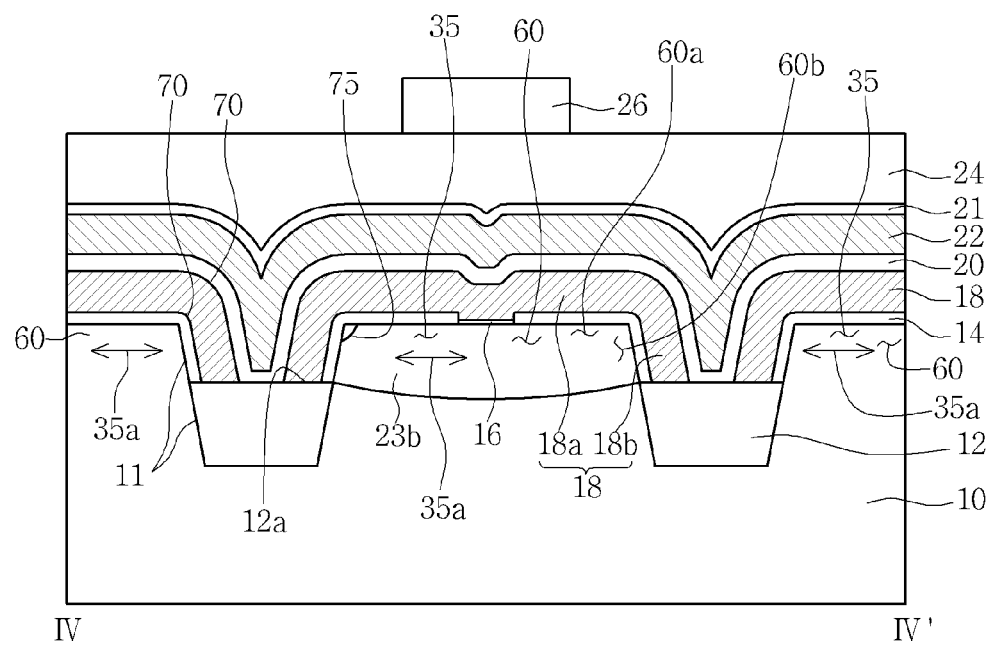

FIG. 4 is a cross-sectional view taken along the line IV-IV' of FIG. 2. As illustrated in FIG. 4, the floating gate electrode 18 may surround an upper part or surface 60a and side parts 60b of an active region 60 and protrude from a top surface of an element isolation film 12 which is formed at a predetermined level in a trench 11 and may be rounded at several sections 70 thereof. Upper and lower rounded sections 70 of the floating gate electrode 18 may form angles 75 between the top parts 60a and the side parts 60b adjacent the trench of the active region that are greater than 90 degrees.

In an example embodiment of the present general inventive concept, the floating gate electrode 18 includes an upper electrode 18a that is formed to extend above a center and side portions of the active region 60 and a plurality of side electrodes 18b that are formed at both sides of the active region 60. The side electrode 18b may be formed along an angled or inclined plane of the trench 11 in which an element isolation film 12 is formed. A plurality of side electrodes 18b may be formed in each of the trenches 11. Thus, the gate dielectric 14, the side portions 18b of the floating gate electrode 18, and the dielectric film 20 all contact an upper surface 12a of the element isolation film 12 within the trench 11. These layers as well as the control gate (sense line) 22 extend below the upper/front surface of the substrate 10 to better isolate the active regions 60 and form memory cell regions. Therefore, the floating gate electrode 18 three-dimensionally surrounds the active region 60 using two side electrodes 18b in addition to the upper electrode 18a. As a result, it is possible to better isolate the active regions and reduce cell size and thus increase or maximize the performance of a device.

The floating gate electrode 18 of the memory transistor 50 may capture electrons tunneled through the tunnel oxide film 16 and store data. A channel may be formed in the active region 60 by the electric field induced by the sense line 22 and the floating gate electrode 18 through the first dielectric film 14. Therefore, since the floating gate electrode 18 is formed so as to surround side portions 60b of the active region 60 in addition to the upper part 60a of the active region 60, the depth and width of the channel can be increased, resulting in an improvement of the performance of the memory transistor 50. The depth of the active region 60 is not limited to the depth of the side portions 60b, but may extend lower into the substrate 10 such as to be adjacent or lower than the element isolation region 12 depending on the biasing characteristics, doping levels, doping depths, and other adjustable components of the memory device 100.

The active region may have an island shape in which the periphery thereof protrudes from the element isolation film 12. The element isolation region 12 may have an upper surface 12a having a planar shape as illustrated in FIG. 4, or may include an indented U-shape to receive the multiple layers of gate dielectric 14, floating gate electrode 18, dielectric film 20, and control gate electrode 22. The first dielectric film 14 and the tunnel oxide film 16 are formed on the active region 60. The second dielectric film 20, the sense line 22, the fourth dielectric interlayer insulating film 24, and the bit line 26 are formed on the floating gate electrode 18.

As illustrated in FIG. 4, the active regions 60 of the substrate include a channel region 35 in which electrons or holes, depending on the channel conductivity type, flow along the length 35a of the channel, in a length direction of the channel, also called the channel length. According to an exemplary embodiment of the present general inventive concept, side portions 18b of the floating gate electrode 18 formed between the first dielectric layer 14 and the second dielectric layer 20 may intersect the channel 35 in the length direction 35a and may extend down to the upper surface 12a of the element isolation films 12 disposed at both sides of the channel, thereby three-dimensionally surrounding the channel.

Next, a method of manufacturing the non-volatile memory device having the above-mentioned structure according to the example embodiment of the present general inventive concept will be described.

FIGS. 5A to 6J are cross-sectional views taken along the lines III-III' and IV-IV' sequentially illustrating processes of the method of manufacturing the non-volatile memory device according to the example embodiment of the present general inventive concept.

Figure 5A:
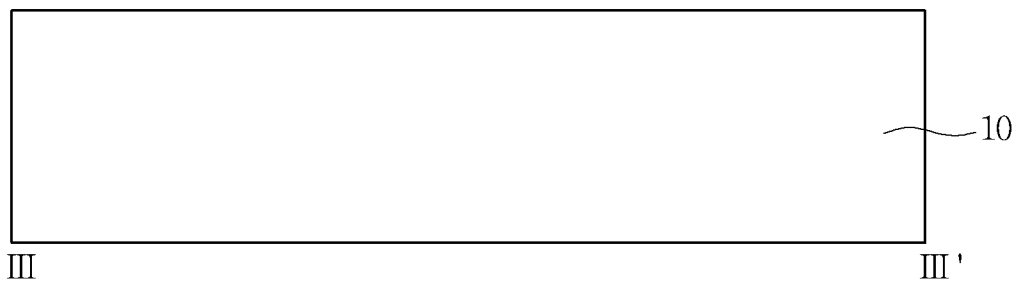
FIGS. 5A to 5J are cross-sectional views sequentially illustrating a process of manufacturing the non-volatile memory device illustrated in FIG. 3.
Figure 6A:
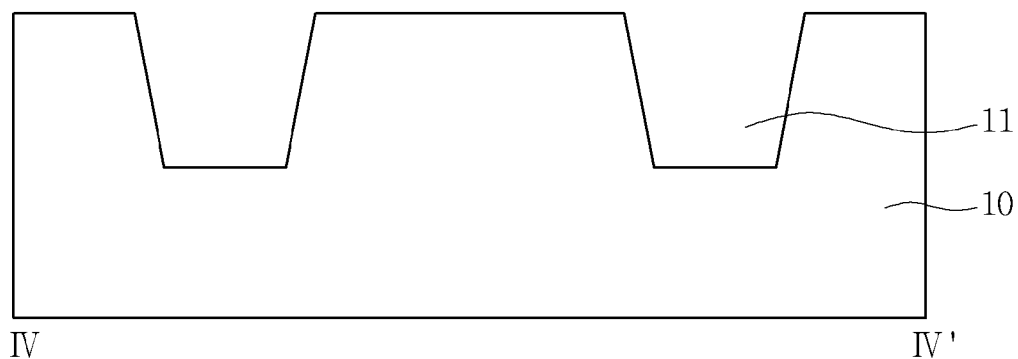

As illustrated in FIGS. 5A and 6A, an upper portion of the substrate 10 doped with acceptor-type (p-type) impurities as channel impurities is removed to a predetermined depth to form the trenches 11. The trenches 11 isolate the active regions in which active elements, such as transistors and diodes, and passive elements such as resistors, capacitors, and inductors may be formed in the substrate 10.

Figure 5B:
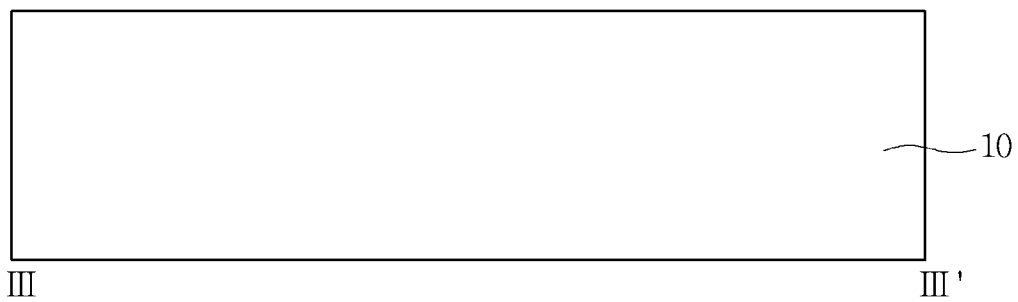
Figure 6B:
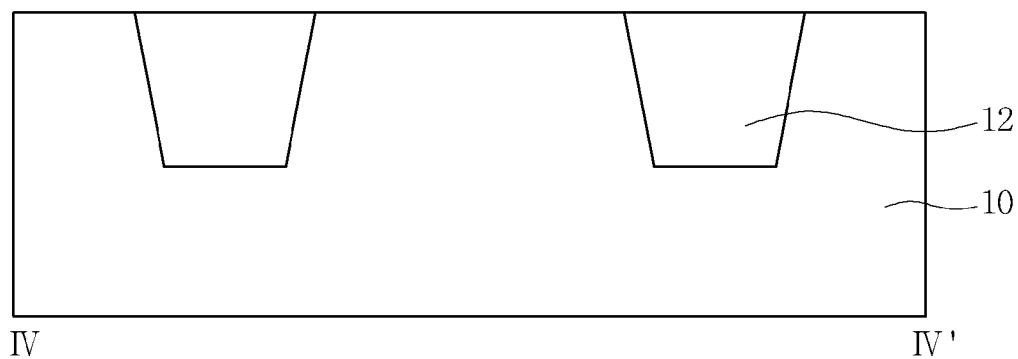

As illustrated in FIGS. 5B and 6B, the element isolation film 12 may be formed to fill the trenches 11. The element isolation film 12 may be formed by a shallow trench isolation (STI) process. To form the element isolation film 12, an insulating silicon oxide film, serving as a gap filling oxide film, may be formed with a predetermined thickness on the substrate 10 having the trenches 11 formed therein, and the silicon oxide film may then be planarized such that the substrate 10 is exposed in area not including the trenches 11. In this way, the element isolation film 12 is formed to have a top surface co-planar with the upper surface of the active regions of the substrate 10.

Figure 5C:
Figure 6C:
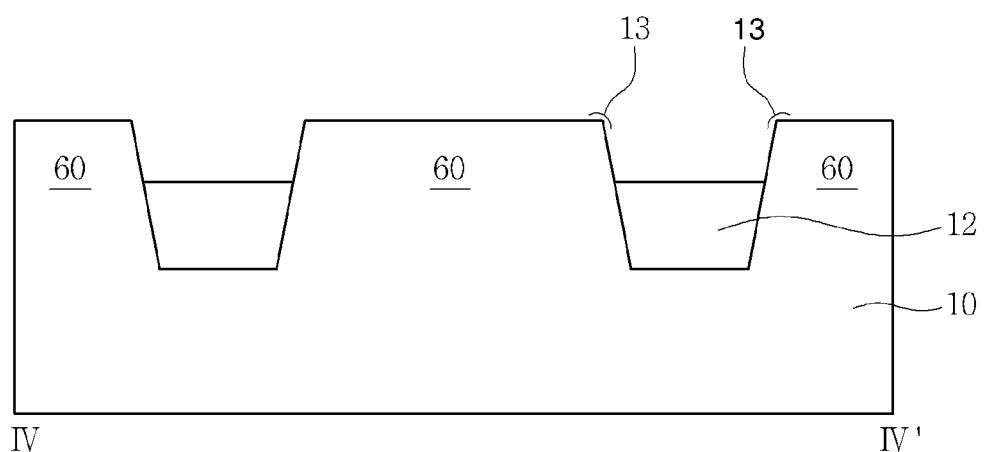

As illustrated in FIGS. 5C and 6C, a portion of the element isolation film 12 formed in the trench 11 may be removed to a predetermined depth. In the example embodiment of the present general inventive concept, the element isolation film 12 in the trench 11 may be removed by a dry etching method or a wet etching method.

The dry etching method may remove the element isolation film 12, which is a silicon oxide film, with fluorine gas, hydrogen fluoride gas, or vapor including a hydrogen fluoride component. The dry etching method has good etching characteristics in the vertical direction and may easily remove the element isolation film. However, as illustrated in FIG. 6C edges 13 of the active region 60 protruding from the element isolation film 12 may be sharp. The sharp edges 13 may cause the breakdown of the first dielectric film 14 to be formed in the subsequent process due to the concentration of an electric field during the operation of the memory transistor 50.

The wet etching method may selectively remove the element isolation film 12 with an etchant including at least one of fluoric acid, hydrochloric acid, nitric acid, and sulfuric acid having high etch selectivity with respect to the silicon oxide film. The wet etching method is a high-speed etching method using a liquid having a density higher than that of gas, and can partially etch the silicon substrate 10 together with the silicon oxide film. Therefore, it is possible to round the edges 13 of the active region 60 exposed when the element isolation film 12 is removed so that the first dielectric film 14 is not broken down upon formation and subsequent operation. Also, the silicon oxide element isolation film 12 of limited depth may be formed by a selective deposition technique, such as by CVD or PECVD to specify a desired depth of the element isolation film 12 to be formed within the trenches 11.

In addition, in order to round the edges 13 of the active region 60 adjacent to the element isolation film 12, a rapid thermal process may be performed to form a sacrificial oxide film, and the dry etching method or the wet etching method may be performed to remove the sacrificial oxide film together with the element isolation film 12 to a predetermined depth.

Figure 5D:
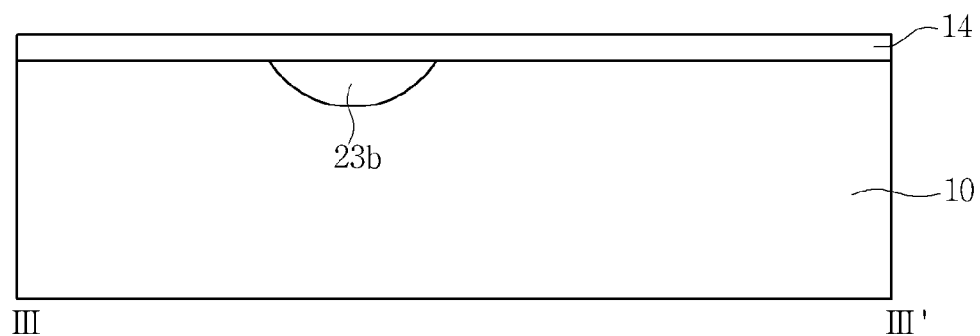
Figure 6D:
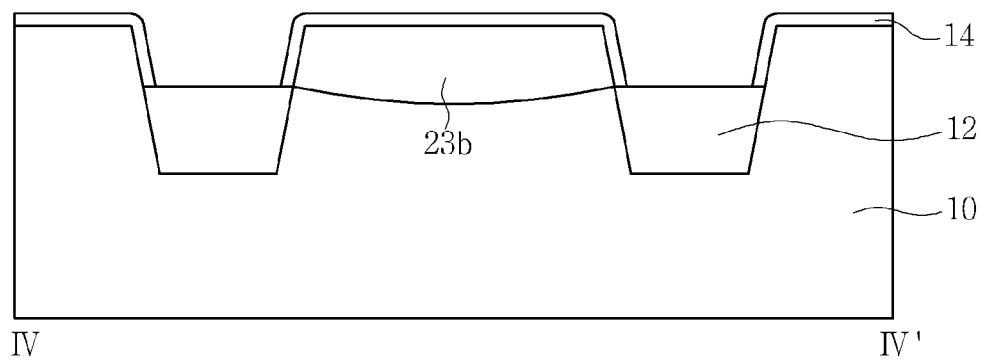

As illustrated in FIGS. 5D and 6D, the first dielectric film 14 may be formed on the entire surface of the active region exposed from the element isolation film 12. Then, conductive impurities may be implanted into a portion of the substrate 10 below the first dielectric film 14 by ion implantation to form the doped regions 23b as well as 23a and 23c (not illustrated). The first dielectric film 14 may be formed with a thickness of about 70 Å to about 120 Å by the rapid thermal process. In the rapid thermal process, the first dielectric film 14, which can be a silicon oxide film, may be formed by oxidizing the surface of the silicon substrate 10. In this way the first dielectric film 14 may be formed with a uniform thickness on the entire surface of the silicon or other semiconductor material substrate 10 other than the trenches 11 that include the element isolation film 12.

Also, as illustrated in FIG. 6D, the depth of the doped region 23b may be extended to a depth below the top of the element isolation film 12, and above the bottom portion of the trench 11. In this way, the active regions may be disposed within the boundaries of the isolation regions thus allowing the selection transistors 40 and memory transistors 50 to operate without interference from neighboring active region portions.

Figure 5E:
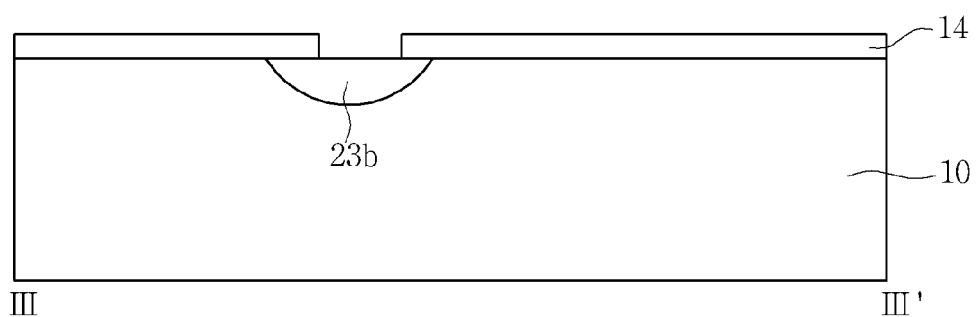
Figure 6E:
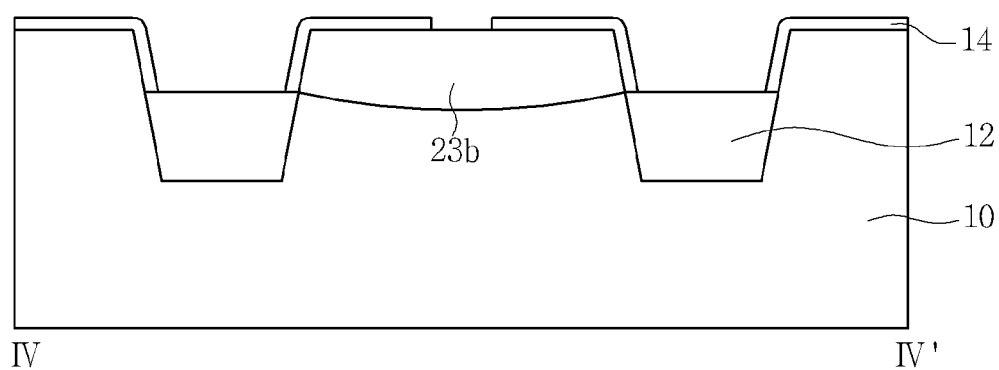

As illustrated in FIGS. 5E and 6E, the first dielectric film 14 formed on the active region in which the memory transistor 50 and selection transistor 40 is formed may be removed to expose the surface of the substrate 10 above the doped region 23b. The first dielectric film 14 may be removed by the wet etching method using at least one of fluoric acid, hydrochloric acid, nitric acid, and sulfuric acid. The ion implantation of the conductive impurities is performed to facilitate the capture of electrons moved through the channel below the tunnel oxide film 16 to be formed in the subsequent process.

Figure 5F:
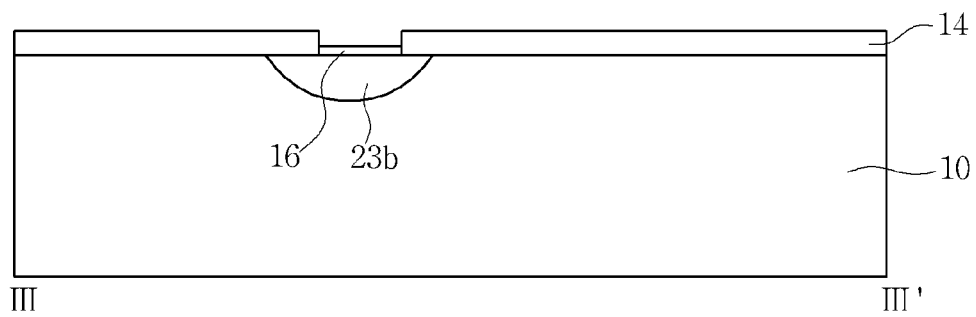
Figure 6F:
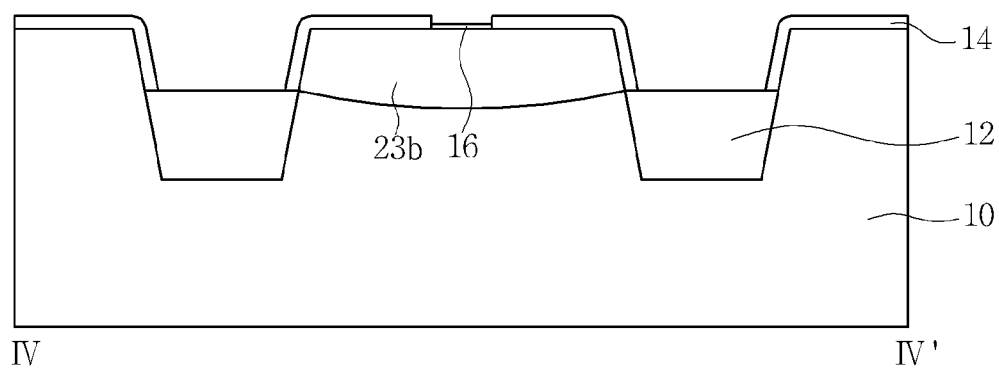

As illustrated in FIGS. 5F and 6F, the tunnel oxide film 16 is formed on the surface of the substrate 10 exposed from the first dielectric film 14 by the rapid thermal process. In an example embodiment of the present general inventive concept, the tunnel oxide film 16 is formed with a thickness of about 50 Å to about 80 Å. The tunnel oxide film 16 can tunnel electrons between the active region of the substrate 10 and the floating gate electrode 18 to be formed in the subsequent process.

Figure 5G:
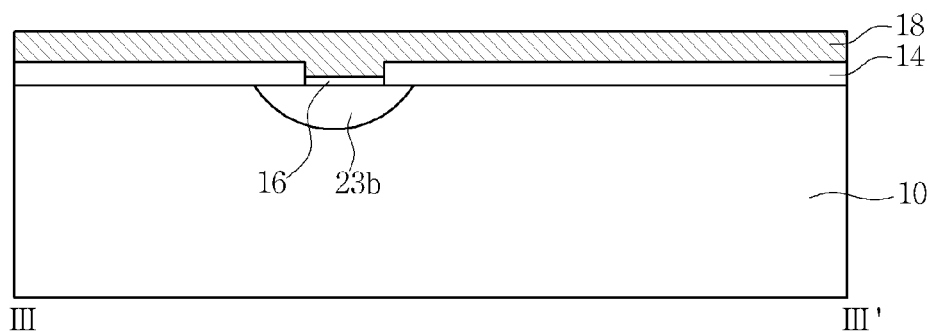
Figure 6G:
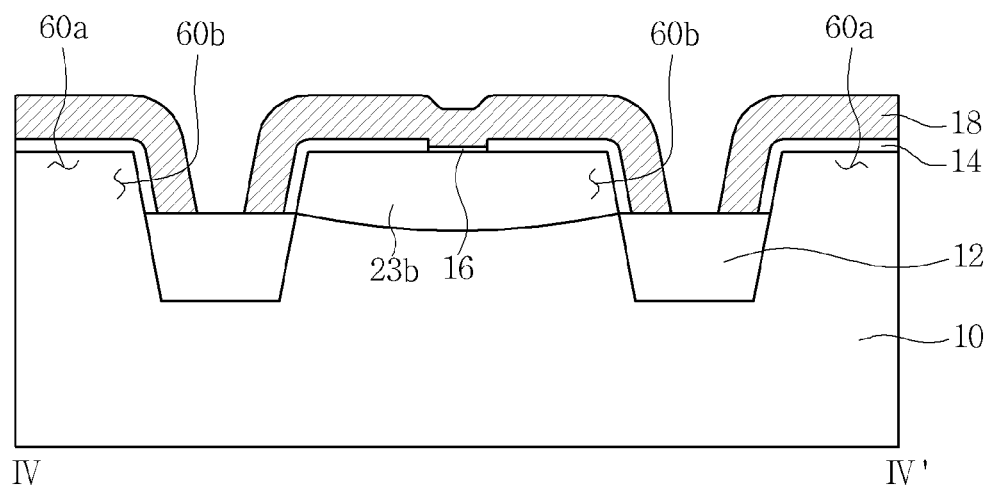

As illustrated in FIGS. 5G and 6G, the floating gate electrode 18 is formed on the first dielectric film 14 and the tunnel oxide film 16. In an embodiment of the present general inventive concept, a portion of the floating gate electrode 18 used to form the memory transistor 50 may be formed on the upper surface of the element isolation film 12 in the trench 11 while surrounding and bordering the upper part 60a and side parts 60b of the active region defined by the element isolation film 12. The floating gate electrode 18 may be made of polysilicon doped with conductive impurities. Similarly, in the case of the selection transistor 40, the gate electrode layer 18 that is used to form the gate electrode 19 on the dielectric film 14 may be formed so as to surround the upper part 60a and side parts 60b of the active region in which the channel is formed.

Therefore, in the method of manufacturing the non-volatile memory device according to the example embodiment of the present general inventive concept, the floating gate electrode 18 may be formed in the trench 11 from which a portion of the element isolation film 12 is removed so as to be rounded. Therefore, it is possible to improve the performance of a device.

Figure 5H:
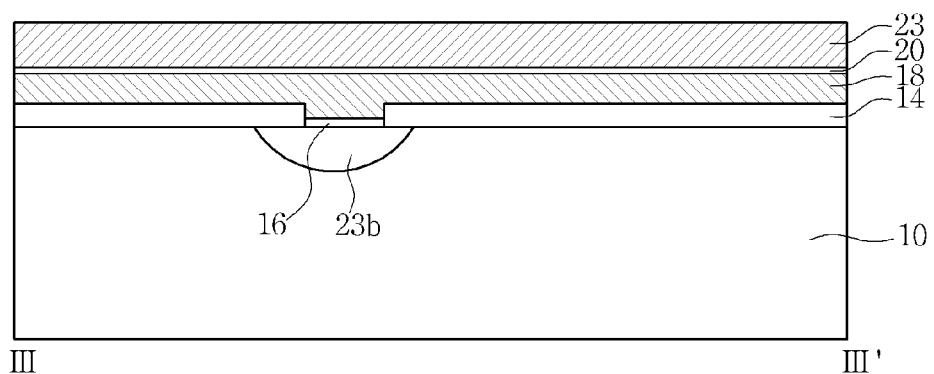
Figure 5I:
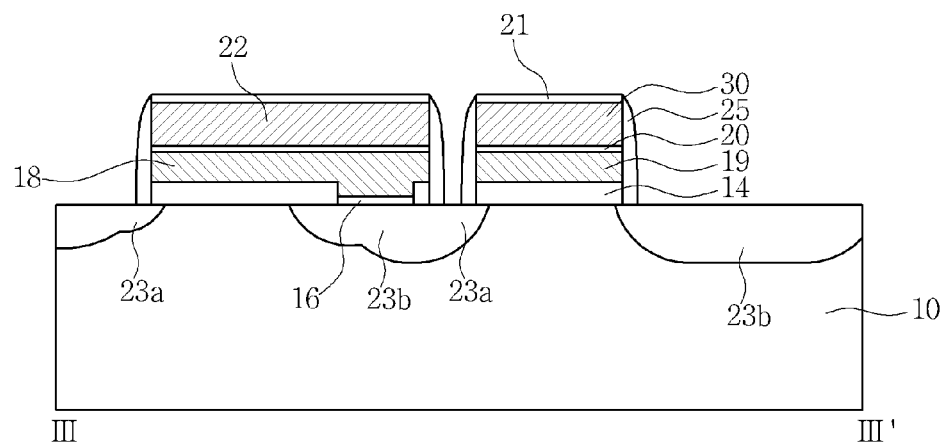
Figure 6H:
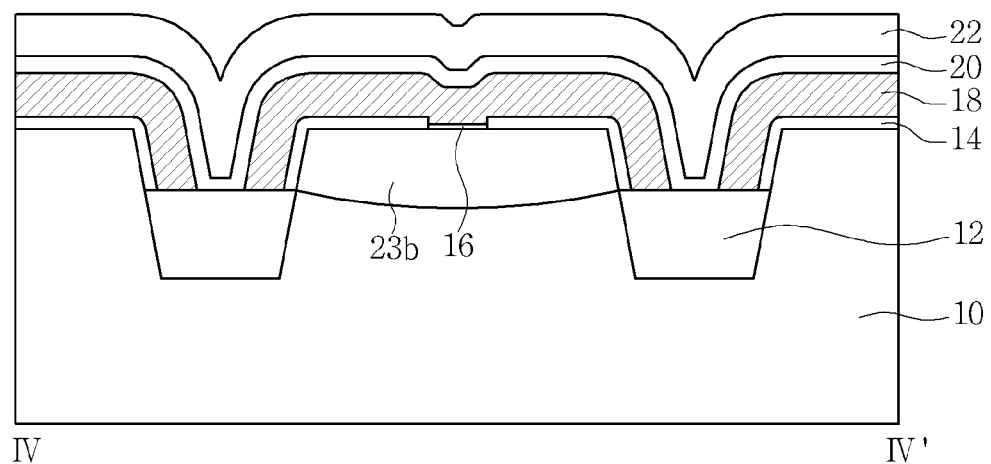

As illustrated in FIGS. 5H and 6H, the second dielectric film 20 and a conductive layer 23 are formed on the floating gate electrode 18. The conductive layer 23, when patterned, may be used to form the sense line 22 and the word line 30 of the respective memory transistor 50 and selection transistor 40. The third dielectric film 21 may be formed on the sense line 22 and world line 30. The second dielectric film 20 may be an insulating film having an ONO structure including an oxide film, a nitride film, and an oxide film laminated in this order. Although not illustrated in the drawings, a portion of the second dielectric film 20 formed on the gate electrode 19 of the selection transistor 40 may be removed to form a contact hole. The sense line 22 serves as a control gate electrode of the memory transistor 50 and may induce charge in the floating gate electrode 18 with the second dielectric film 20 interposed therebetween. The sense line 22 and the word line 30 may be formed by forming the conductive layer 23, which is a conductive metal layer, and the third dielectric film 21, on the substrate 10 having the third dielectric film 21 formed thereon and patterning the second dielectric film 20 and conductive layer 23. The word line 30 may be electrically connected to the gate electrode 19 through the contact hole. In this case, the sense line 22 and the word line 30 may be exposed from the uppermost parts of the floating gate electrode 18 and the gate electrode 19 and may be formed as a gate stack during a patterning process. Therefore, after patterning the gate layers as illustrated in FIG. 5I, portions of the active region 60 to correspond to source/drain regions at both sides of the gate stacks become exposed, or no longer covered by the conductive and dielectric layers.

Figure 6I:
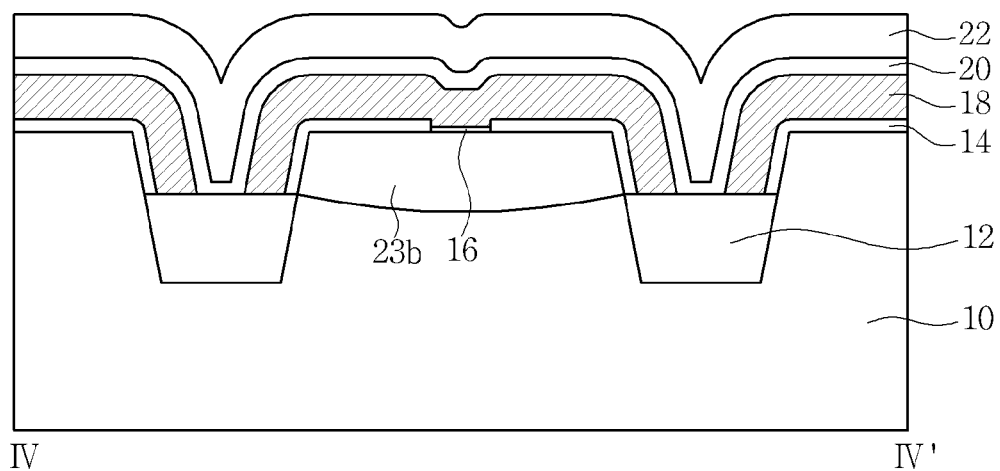

As illustrated in FIGS. 5I and 6I, conductive impurities may be implanted into the active region 60 by ion implantation using the gate stack as a mask, thereby forming the source/drain regions 23a, 23b and 23c. The source/drain regions 23a, 23c, and 23b may be formed by implanting donor-type impurity ions at a low concentration, medium concentration, and a high concentration. In an embodiment of the present general inventive concept, donor-type impurities may be implanted at a low concentration by ion implantation using the gate stack as an ion implantation mask to form a lightly doped drain (LDD) 23a, and the spacer 25 may be formed on the side wall of the gate stack. Then, the donor-type impurities may be implanted at a medium or high concentration by ion implantation using the gate stack and the spacer 25 as an ion implantation mask, thereby forming the source and the drain regions 23b and 23c.

Figure 5J:
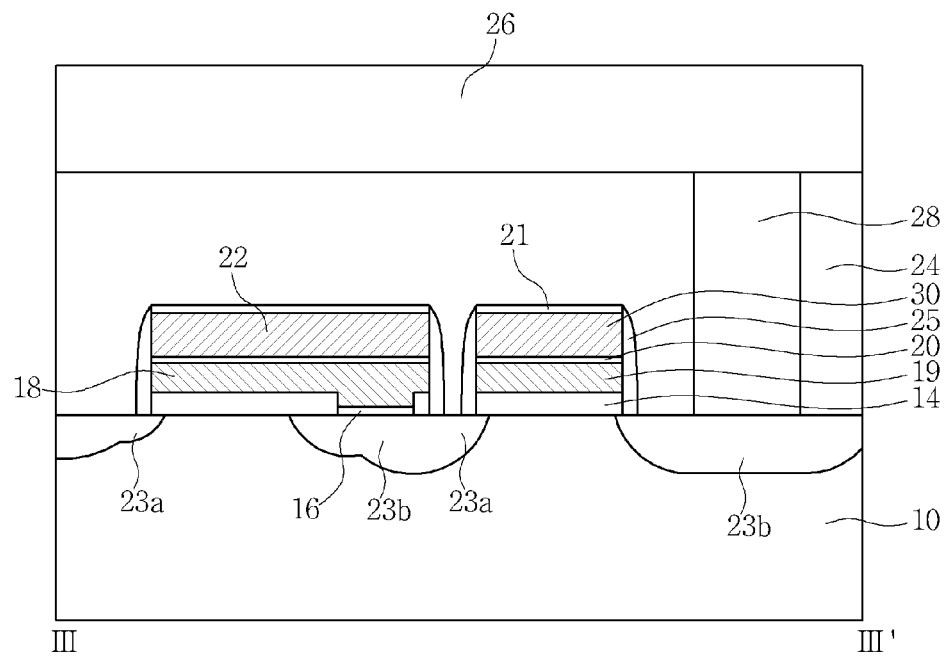
Figure 6J:
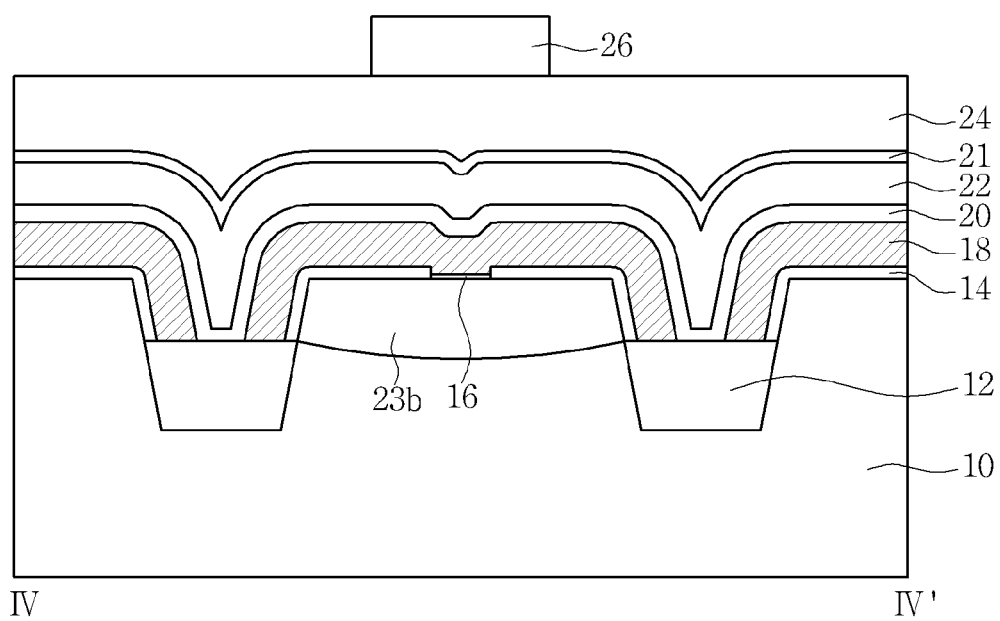

As illustrated in FIGS. 5J and 6J, the fourth dielectric interlayer insulating film 24 is formed, and the contact plug 28 electrically connected to the drain electrode 23b of the selection transistor 40 and the bit line 26 are formed. The fourth dielectric interlayer insulating film 24 is an interlayer insulating film that electrically insulates the memory transistor 50 and the selection transistor 40 from the bit line 26. The fourth dielectric interlayer insulating film 24 is a silicon oxide film formed by a chemical vapor deposition method.

The contact plug 28 may be formed by removing the fourth dielectric interlayer insulating film 24 on the drain electrode 23b of the selection transistor 40 to form a contact hole and filling the contact hole with a conductive metal material such as tungsten. The bit line 26 may be formed in the horizontal direction while being electrically connected to the contact plug 28.

While example embodiments have been particularly illustrated and described, it will be understood by one of ordinary skill in the art that variations in form and detail may be made therein without departing from the spirit and scope of the claims. For example, while the source/drain regions are described as being n-type, and thus the active region and channel being p-type, the source/drain regions may also be p-type, and the active and channel regions of the substrate 10 may by n-type.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A non-volatile memory device comprising:
an active region in which a channel of a transistor is formed in a substrate, the channel having a length direction;
element isolation films defining the active region and formed on the substrate at both sides of the channel at a height lower than an upper surface of the active region;
a first dielectric layer, a second dielectric layer, and a control gate electrode formed on the active region; and
a floating gate electrode formed between the first dielectric layer and the second dielectric layer so as to intersect the channel in the length direction and extend to a portion of the upper surfaces of the element isolation films at both sides of the channel, to thereby surround the channel wherein the floating gate electrode on the element isolation films is discontinuous.

2. The non-volatile memory device of claim 1, wherein the floating gate electrode includes:
an upper electrode formed above a center of the active region; and
a plurality of side electrodes formed at both sides of the center of the active region.

3. The non-volatile memory device of claim 2, wherein the side electrodes are formed along inclined planes of a plurality of trenches in which the element isolation films are formed.

4. The non-volatile memory device of claim 1, further comprising:
a tunnel oxide film formed with a thickness smaller than that of the first dielectric film between the floating gate electrode and the active region.

5. The non-volatile memory device of claim 1, wherein the floating gate electrode is formed of a polysilicon doped with conductive impurities.

6. The non-volatile memory device of claim 1, wherein both ends of the floating gate electrodes terminate on the upper surface of the element isolation films.

7. A method of manufacturing a non-volatile memory device, comprising:
removing portions of a substrate to form trenches with a predetermined depth;
filling the trenches to form element isolation films that define an active region in which a channel of a transistor is formed;
removing a portion of the element isolation film in the trench to a predetermined depth to expose the active region;
forming a first dielectric film on the entire surface of the substrate;
forming a floating gate electrode on the first dielectric layer so as to intersect the channel in a length direction of the channel and extend to the upper surfaces of the element isolation films at both sides of the channel, thereby surrounding the channel such that the floating gate electrode on the element isolation films is discontinuous;
forming a second dielectric film on the entire surface of the substrate; and
forming a control gate electrode on the second dielectric film on the floating gate electrode.

8. The method of manufacturing a non-volatile memory device of claim 7, wherein the portion of the element isolation film is removed by a wet etching method.

9. The method of manufacturing a non-volatile memory device of claim 8, further comprising:
forming a sacrificial oxide film on the active region exposed from the element isolation film before the element isolation film is removed.

10. A non-volatile semiconductor memory device, comprising:
a bit line;
a contact plug connected to the bit line and connected to a source/drain of a plurality of selection transistors; and
a plurality of memory transistors disposed adjacent the selection transistors and disposed above a channel of an active region of a semiconductor substrate, comprising:
element isolation films defining the active region and formed on the semiconductor substrate at both sides of the channel at a height lower than an upper surface of the active region; and
a plurality of floating gate electrode layers having an upper electrode and side electrodes, wherein the upper electrode and side electrodes three-dimensionally surround the active region of the memory transistors to intersect the channel in a length direction of the channel and extend to a portion of the upper surfaces of the element isolation films at both sides of the channel, wherein the floating gate electrode layers on the element isolation films is discontinuous.

11. A memory cell apparatus including a selection transistor and a memory transistor to be used in a non-volatile memory array, comprising:
a substrate having an active region and a plurality of trenches formed in an upper surface of the active region;
a plurality of shallow trench isolation (STI) layers formed within the plurality of trenches to a height lower than the upper surface of the active region, the top surface of STI layers having a planar surface within the trenches; and
a conductive layer to serve as a floating gate for the selection transistor and memory transistor, the conductive layer including an upper electrode and a plurality of side electrodes in that the plurality of side electrodes extend to the top surface of the STI layers to surround an active region of the substrate, wherein the conductive layer on the upper surface of the STI layers is discontinuous.

12. The apparatus of claim 11, further comprising:
a tunnel oxide film formed in the memory transistor; and
a medium-doped and highly-doped source/drain region formed in the active region below the tunnel oxide film.

13. The apparatus of claim 11, further comprising:
a gate dielectric layer having a first dielectric film with a first thickness and a second dielectric film of a second thickness thinner than the first thickness formed below the floating gate of the memory transistor.

14. The apparatus of claim 13, wherein the first gate dielectric film surrounds the second dielectric film.

15. A method of forming a memory cell including a selection transistor and a memory transistor, the method comprising:
forming a semiconductor substrate having an active region and a plurality of trenches formed in an upper surface of the active region;
forming a shallow trench isolation (STI) layer within the plurality of trenches to a height lower than the upper surface of the active region, the top surface of STI layer having a planar surface within the trenches; and
forming a conductive layer to serve as a floating gate for the selection transistor and memory transistor, the conductive layer including an upper electrode and a plurality of side electrodes such that the plurality of side electrodes extend to the top surface of the STI layer to surround an active region of the substrate within the memory transistor and such that the conductive layer on the top surface of the STI layer is discontinuous.

16. The method of claim 15, further comprising forming a tunnel oxide layer above a central portion of the active region.

17. The method of claim 15, further comprising:
forming a first dielectric film below the conductive layer and a second dielectric film above the conductive layer such that the first and second dielectric films extend to the upper surface of the STI layer to surround an active region of the substrate.

18. The method of claim 15, wherein the STI layer is formed by deposition.

* * * * *